US012688350B2

(12) United States Patent
Gaitonde et al.

(10) Patent No.: US 12,688,350 B2
(45) Date of Patent: Jul. 21, 2026

(54) RUNTIME EFFICIENT MULTI-STAGE ROUTER FLOW FOR CIRCUIT DESIGNS

(71) Applicant: Xilinx, Inc., San Jose, CA (US)

(72) Inventors: Dinesh D. Gaitonde, Freemont, CA (US); Chirag Ravishankar, Erie, CO (US); Stefan Nikolic, Vaud (CH)

(73) Assignee: Xilinx, Inc., San Jose, CA (US)

( * ) Notice: Subject to any disclaimer, the term of this patent is extended or adjusted under 35 U.S.C. 154(b) by 722 days.

(21) Appl. No.: 18/066,231

(22) Filed: Dec. 14, 2022

(65) Prior Publication Data

US 2024/0202423 A1    Jun. 20, 2024

(51) Int. Cl.
*G06F 30/3947*        (2020.01)

(52) U.S. Cl.
CPC ................................. *G06F 30/3947* (2020.01)

(58) Field of Classification Search
CPC .................................................... G06F 30/3947
USPC ........................................................ 716/129
See application file for complete search history.

(56) References Cited

U.S. PATENT DOCUMENTS

| | | | | |
|---|---|---|---|---|
| 7,065,729 | B1 * | 6/2006 | Chapman | G06F 30/394 |
| | | | | 716/129 |
| 7,107,564 | B1 * | 9/2006 | Teig | G06F 30/394 |
| | | | | 716/129 |
| 7,240,320 | B1 | 7/2007 | Trimberger et al. | |
| 7,310,793 | B1 * | 12/2007 | Teig | H01L 23/528 |
| | | | | 257/774 |
| 7,367,007 | B1 | 4/2008 | Sundararajan et al. | |
| 7,376,926 | B1 | 5/2008 | Kong et al. | |
| 7,516,437 | B1 | 4/2009 | Kannan et al. | |
| 7,620,923 | B1 | 11/2009 | Kong et al. | |
| 7,724,033 | B1 | 5/2010 | Zen | |
| 7,873,931 | B1 | 1/2011 | Donlin | |
| 8,015,535 | B1 | 9/2011 | Kong et al. | |
| 8,103,992 | B1 | 1/2012 | Chan et al. | |
| 8,104,011 | B1 | 1/2012 | Sundararajan et al. | |
| 8,312,409 | B1 | 11/2012 | Jain et al. | |
| 8,671,379 | B1 | 3/2014 | Jain et al. | |
| 9,330,220 | B1 | 5/2016 | Dehkordi et al. | |
| 9,372,953 | B1 | 6/2016 | Chandrakar et al. | |
| 9,646,126 | B1 | 5/2017 | Lu et al. | |
| 10,296,699 | B1 | 5/2019 | Yu et al. | |
| 10,445,456 | B1 | 10/2019 | Fraisse | |
| 10,614,191 | B1 | 4/2020 | Fraisse et al. | |
| 10,628,547 | B1 * | 4/2020 | Swarbrick | G06F 30/347 |
| 10,839,125 | B1 | 11/2020 | Venkatakrishnan et al. | |
| 11,238,206 | B1 | 2/2022 | Sivaswamy et al. | |
| 2001/0018759 | A1 * | 8/2001 | Andreev | G06F 30/394 |
| | | | | 716/129 |

(Continued)

*Primary Examiner* — Suchin Parihar
(74) *Attorney, Agent, or Firm* — Kevin T. Cuenot

(57)    ABSTRACT

Multi-stage routing for a circuit design includes performing, using computer hardware, a global routing of the circuit design using a hybrid routing graph for a target integrated circuit. The hybrid routing graph includes routing nodes and a plurality of coarsened routing nodes. Each coarsened routing node includes a plurality of constituent routing nodes that are treated as a single node during the global routing. A detailed routing of the circuit design is performed using the computer hardware to generate a legal routing solution for the circuit design. The detailed routing is performed by routing, in parallel, the nets of the circuit design that were globally routed using the plurality of coarsened routing nodes.

16 Claims, 8 Drawing Sheets

(56)     References Cited

U.S. PATENT DOCUMENTS

| 2003/0174723 | A1* | 9/2003 | DeHon | H04L 49/10 |
| | | | | 370/519 |
| 2004/0044979 | A1* | 3/2004 | Aji | G06F 30/394 |
| | | | | 716/135 |
| 2011/0055784 | A1* | 3/2011 | Gao | G06F 30/394 |
| | | | | 716/125 |
| 2011/0055790 | A1* | 3/2011 | Gao | G06F 30/394 |
| | | | | 716/130 |
| 2014/0215426 | A1* | 7/2014 | He | G06F 30/392 |
| | | | | 716/129 |
| 2019/0280969 | A1* | 9/2019 | Liu | H04L 45/48 |
| 2023/0145783 | A1* | 5/2023 | Çördük | G06F 9/3877 |
| | | | | 718/102 |
| 2023/0205968 | A1* | 6/2023 | Kahng | G06F 30/3953 |
| | | | | 716/129 |

* cited by examiner

600

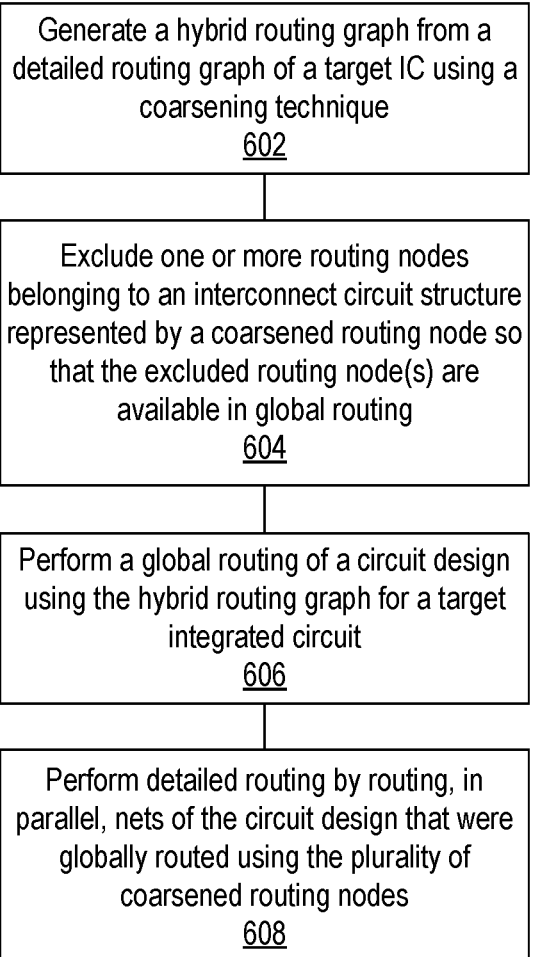

Generate a hybrid routing graph from a
detailed routing graph of a target IC using a
coarsening technique
602

Exclude one or more routing nodes
belonging to an interconnect circuit structure
represented by a coarsened routing node so
that the excluded routing node(s) are
available in global routing
604

Perform a global routing of a circuit design
using the hybrid routing graph for a target
integrated circuit
606

Perform detailed routing by routing, in
parallel, nets of the circuit design that were
globally routed using the plurality of
coarsened routing nodes
608

FIG. 6

RUNTIME EFFICIENT MULTI-STAGE ROUTER FLOW FOR CIRCUIT DESIGNS

TECHNICAL FIELD

This disclosure relates to integrated circuits (ICs) and, more particularly, to a multi-stage router flow for routing circuit designs for implementation within ICs.

BACKGROUND

Implementing a circuit design within an integrated circuit (IC), whether a programmable IC or an application specific IC (ASIC), entails processing the circuit design through a design flow. To physically realize the circuit design within the IC, the circuit design undergoes a multi-phase process referred to as a design flow. The phase of the design flow typically include synthesis, placement, and routing. In general, synthesis refers to the process of generating a gate-level netlist from a high-level description of a circuit or system. The netlist may be technology specific in that the netlist is intended for implementation in a particular IC referred to as a "target IC." Placement refers to the process of assigning elements of the synthesized circuit design to particular instances of circuit blocks (e.g., "resources") having specific locations on the target IC. Routing refers to the process of selecting or implementing particular routing resources, e.g., wires and/or other interconnect circuitry, to electrically couple the various circuit blocks of the circuit design as placed on the target IC. The resulting circuit design, having been processed through the design flow, may be implemented within the target IC.

A computer-based Electronic Design Automation (EDA) tool referred to as a "router" is tasked with generating a routing solution for the placed circuit design. The router generates the routing solution while attempting to meet certain objectives such as reducing the overall half-perimeter wirelength of the routing solution and reducing the delays of the critical signal paths (e.g., as determined based on estimated signal delays). The router is successful if a routing solution is determined that specifies non-overlapping routes through the interconnect circuitry of the target IC for every net in the netlist.

Routing is a computationally expensive operation. Of the different phases of the design flow, as performed using computer-based EDA tools, routing often consumes the most compute runtime. For example, depending on the size of the circuit design, routing may require many hours to complete.

SUMMARY

In one or more example implementations, a method includes performing, using computer hardware, a global routing of a circuit design using a hybrid routing graph for a target integrated circuit. The hybrid routing graph includes routing nodes and a plurality of coarsened routing nodes. Each coarsened routing node includes a plurality of constituent routing nodes of the routing graph that are treated as a single node during the global routing. The method includes performing, using the computer hardware, a detailed routing of the circuit design to generate a legal routing solution for the circuit design. The detailed routing is performed by routing, in parallel, the nets of the circuit design that were globally routed using the plurality of coarsened routing nodes.

The foregoing and other implementations can each optionally include one or more of the following features, alone or in combination. Some example implementations include all the following features in combination.

In some aspects, the legal routing solution specifies detailed routes of the nets through the coarsened routing nodes using selected ones of the plurality of constituent routing nodes of the coarsened routing nodes.

In some aspects, the detailed routing is performed by executing a plurality of Satisfiability (SAT) solvers in parallel.

In some aspects, the detailed routing is performed by executing a plurality of iterative routers in parallel.

In some aspects, the detailed routing is performed by executing a plurality of mappers in parallel. Each mapper is configured to select a pre-compiled routing solution from a plurality of pre-compiled routing solutions for a coarsened routing node based on a pin signature for the coarsened routing node.

In some aspects, the plurality of coarsened routing nodes represent interconnect circuit structures of the target integrated circuit.

In some aspects, the interconnect circuit structures are input interconnect blocks.

In some aspects, the plurality of coarsened routing nodes are independent of one another. For example, each coarsened routing node does not overlap, e.g., is non-overlapping, with each other coarsened routing node.

In some aspects, a solution to the global routing is not a legal routing solution.

In some aspects, the method includes excluding a selected routing node belonging to an interconnect circuit structure from a selected coarsened routing node representing the interconnect circuit structure so that the selected routing node is available for use during the global routing.

In one or more example implementations, a system includes one or more hardware processors configured and/or programmed to initiate operations as described within this disclosure.

In one or more example implementations, one or more computer-readable storage mediums have program instructions embodied therewith. The program instructions are executable by computer hardware, e.g., a hardware processor, to cause the computer hardware to initiate and/or execute operations as described within this disclosure.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 6 illustrates an example method of routing a circuit design in accordance with the inventive arrangements described herein.

DETAILED DESCRIPTION

Figure 1:
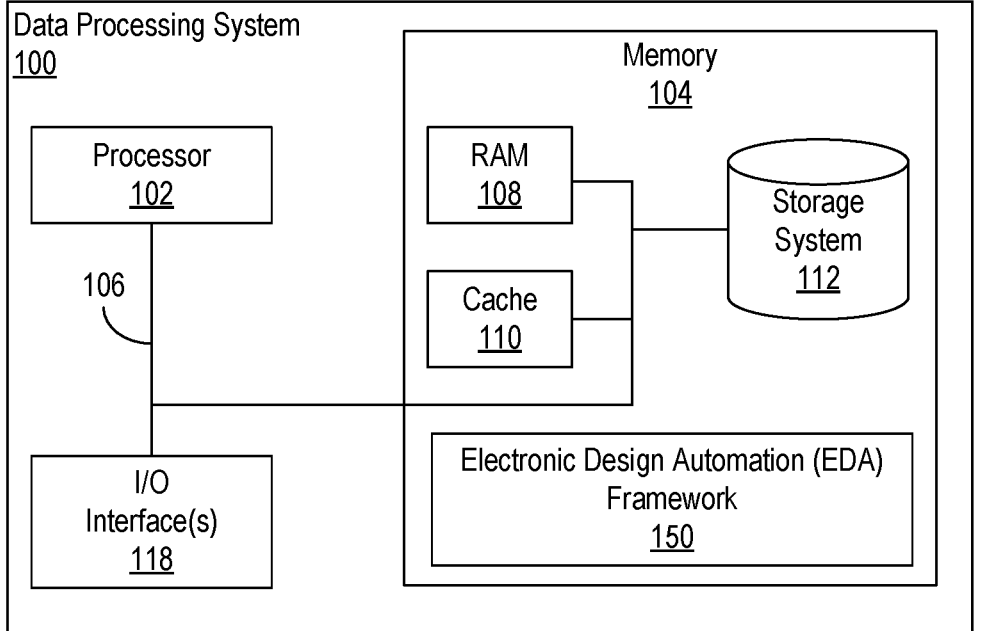
FIG. 1 illustrates an example implementation of a data processing system for use with the inventive arrangements described within this disclosure.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to a multi-stage router flow for routing circuit designs for implementation within ICs. In accordance with the inventive arrangements described within this disclosure, methods, systems, and computer-readable storage mediums are disclosed that implement runtime efficient, multi-stage router flows. The multi-stage router flows described within this disclosure are capable of routing circuit designs in significantly less time compared to other available routing flows.

In some aspects, the multi-stage router flow(s) includes a global routing stage and a detailed routing stage. During the global routing stage, a hybrid routing graph is used. The hybrid routing graph includes both routing nodes and coarsened routing nodes. The coarsened routing nodes simplify the routing graph by representing different sets of underlying routing nodes as a single, larger coarsened routing node. This reduces the number of nodes in the hybrid routing graph that is used for the global routing process. The detailed routing stage is performed to legalize the global routing solution generated during the global routing stage. The detailed routing stage ensures that any nets that are routed using the coarsened routing nodes have a detailed routing for the nets that utilizes the constituent routing nodes represented by the various coarsened routing nodes.

In some aspects, the coarsened routing nodes that are generated are independent of one another. The independence of the coarsened routing nodes means that the nets routed with the coarsened routing nodes may undergo detailed routing in parallel. That is, the detailed routing of a net with respect to determining a route through a coarsened routing node will not have any effect on the detailed routing of another net that traverses through another coarsened routing node. Thus, the different nets traversing through different and independent coarsened routing nodes may be routed in parallel during the detailed routing stage. This reduces the time required to generate a legal routing solution. A legal routing solution is a routing solution for a circuit design that does not include any overlaps. A legal routing solution is said to be "non-overlapping."

Further aspects of the inventive arrangements are described below with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example implementation of a data processing system 100. As defined herein, the term "data processing system" means one or more hardware systems configured to process data, each hardware system including at least one hardware processor programmed to initiate operations and memory. Data processing system 100 can include a processor 102, a memory 104, and a bus 106 that couples various system components including memory 104 to processor 102.

Processor 102 may be implemented as one or more processors. In an example, processor 102 is implemented as a central processing unit (CPU). Processor 102 may be implemented as one or more circuits capable of carrying out instructions contained in program code. The circuit may be an integrated circuit or embedded in an integrated circuit. In this regard, processor 102 is a hardware processor. Processor 102 may be implemented using a complex instruction set computer architecture (CISC), a reduced instruction set computer architecture (RISC), a vector processing architecture, or other known architectures. Example processors include, but are not limited to, processors having an x86 type of architecture (IA-32, IA-64, etc.), Power Architecture, ARM processors, and the like.

Bus 106 represents one or more of any of a variety of communication bus structures. By way of example, and not limitation, bus 106 may be implemented as a Peripheral Component Interconnect Express (PCIe) bus. Data processing system 100 typically includes a variety of computer system readable media. Such media may include computer-readable volatile and non-volatile media and computer-readable removable and non-removable media.

Memory 104 can include computer-readable media in the form of volatile memory, such as random-access memory (RAM) 108 and/or cache memory 110. Data processing system 100 also can include other removable/non-removable, volatile/non-volatile computer storage media. By way of example, storage system 112 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 106 by one or more data media interfaces.

Memory 104 is capable of storing computer-readable program instructions that are executable by processor 102. For example, the computer-readable program instructions can include an operating system, one or more application programs, other program code, and program data. In one or more example implementations, memory 104 may store an Electronic Design Automation (EDA) framework 150. EDA framework 150 may be implemented as one or more modules of program code that is/are executable by processor 102. EDA framework 150, upon execution by processor 102, is capable of performing the operations described within this disclosure.

Figure 8:
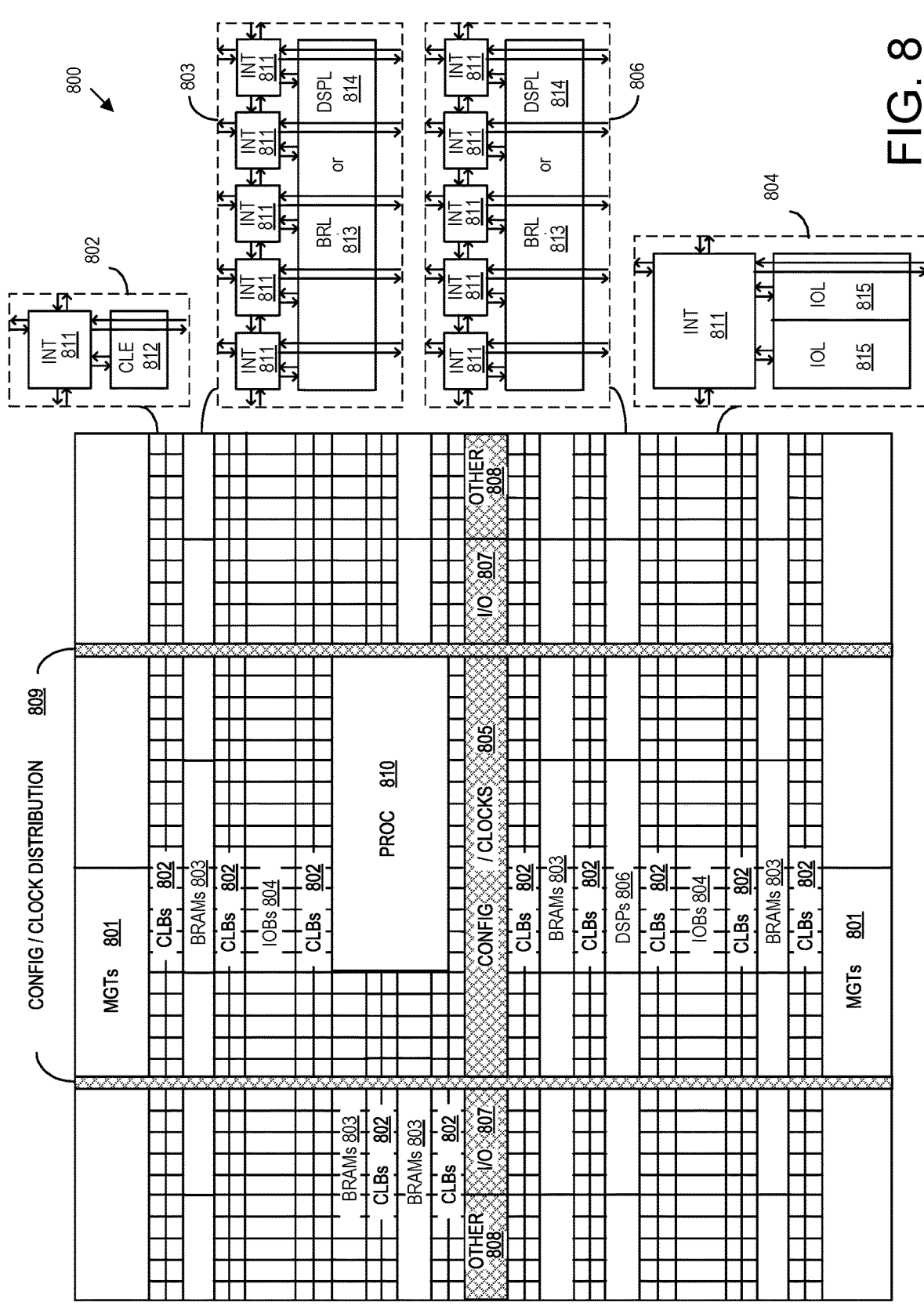
FIG. 8 illustrates an example architecture for an IC in which a circuit design implemented using the example design flows described herein may be implemented.

In one or more example implementations, EDA framework 150 is capable of performing a design flow. The design flow can include synthesis, placement, and/or routing on a circuit design or portion thereof so that a circuit design may be physically realized in a target IC. An example architecture for a target IC is illustrated in FIG. 8. EDA framework 150 may also generate configuration data from a placed and routed circuit design that may be loaded into the target IC to physically realize the circuit design therein as circuitry using the available circuit resources of the target IC.

For example, with regard to the routing stage of the design flow, EDA framework 150 is capable performing a two-stage routing flow. In a first routing stage, EDA framework 150 performs global routing of a circuit design using a hybrid routing graph for the target IC. The hybrid routing graph includes routing nodes and a plurality of coarsened routing nodes. Each coarsened routing node includes a plurality of routing nodes of a detailed routing graph that are treated during the global routing as a single node. In a second routing stage, EDA framework 150 performs detailed routing of the circuit design to generate a legal routing solution for the circuit design. The detailed routing performed by EDA framework 150 is performed by routing nets of the circuit design that were globally routed using the plurality of coarsened routing nodes in parallel.

Processor 102, in executing the computer-readable program instructions, is capable of performing the various operations described herein that are attributable to a computer. It should be appreciated that data items used, generated, and/or operated upon by data processing system 100 are functional data structures that impart functionality when employed by data processing system 100. Circuit designs, routing graphs in various forms, and routing solutions in various forms are examples of data structures used with system 100 and/or EDA framework 150. As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

Data processing system 100 may include one or more Input/Output (I/O) interfaces 118 communicatively linked to bus 106. I/O interface(s) 118 allow data processing system 100 to communicate with one or more external devices and/or communicate over one or more networks such as a local area network (LAN), a wide area network (WAN), and/or a public network (e.g., the Internet). Examples of I/O interfaces 118 may include, but are not limited to, network cards, modems, network adapters, hardware controllers, etc. Examples of external devices also may include devices that allow a user to interact with data processing system 100 (e.g., a display, a keyboard, and/or a pointing device) and/or other devices such as accelerator card.

Data processing system 100 is only one example implementation. Data processing system 100 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

The term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

The example of FIG. 1 is not intended to suggest any limitation as to the scope of use or functionality of example implementations described herein. Data processing system 100 is an example of computer hardware that is capable of performing the various operations described within this disclosure. In this regard, data processing system 100 may include fewer components than shown or additional components not illustrated in FIG. 1 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

Figure 2:
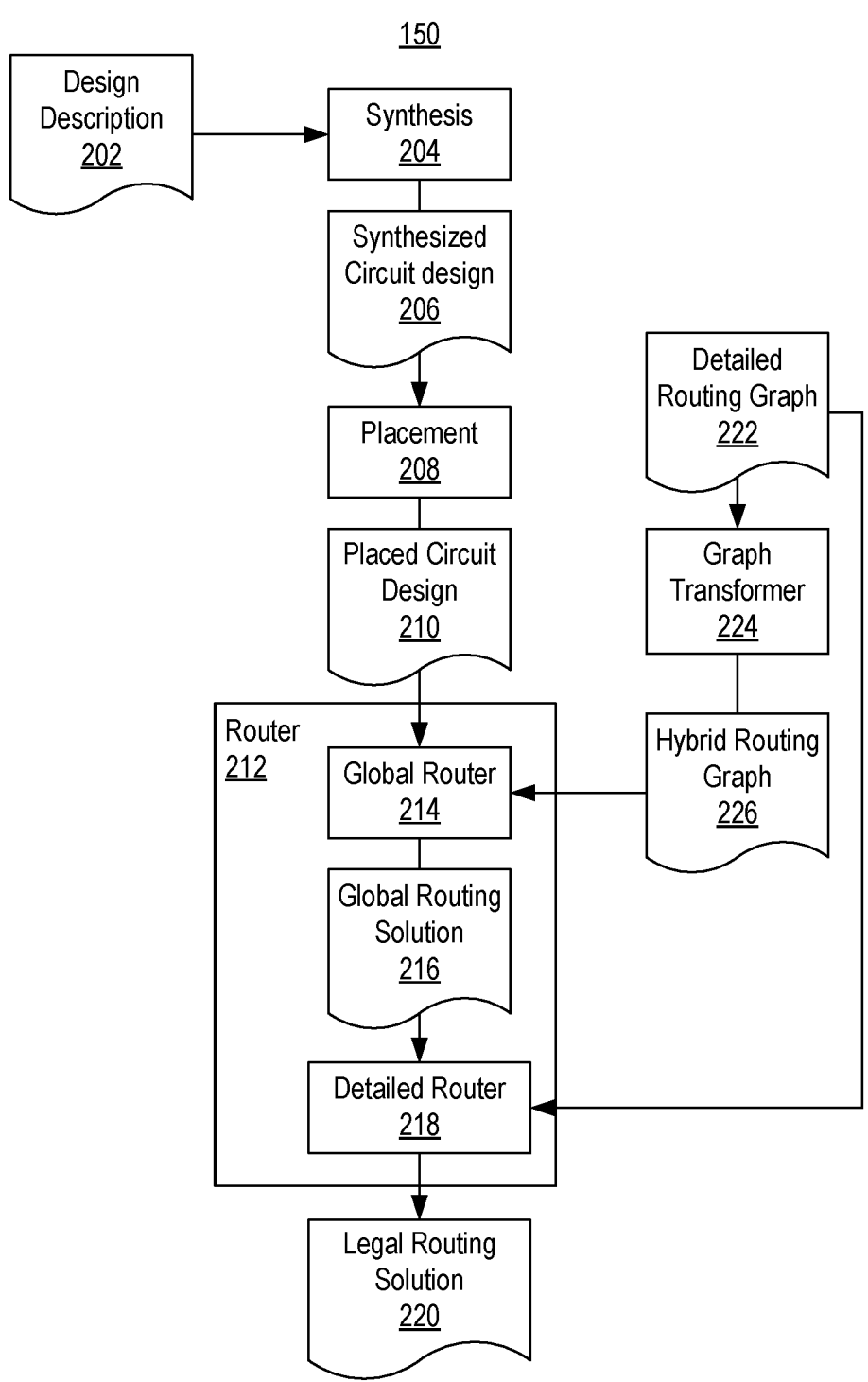
FIG. 2 illustrates certain operative features of an example implementation of an Electronic Design Automation (EDA) framework executable by a data processing system.

FIG. 2 illustrates certain operative features of an example implementation of EDA framework 150 of FIG. 1. As discussed, EDA framework 150 is executable by a data processing system to perform various operations relating to implementing a circuit design.

In the example of FIG. 2, a design description 202 is provided to a synthesis process 204. Design description 202 may be specified as a high-level description of a circuit design. Design description 202 may be specified in a hardware description language and/or in a high-level programming language such as C/C++, SystemC, or the like. Synthesis process 204 is capable of generating synthesized circuit design 206 from design description 202. In one aspect, synthesized circuit design 206 is specified as a netlist. Synthesized circuit design 206 may be technology specific in that synthesized circuit design 206 is intended for implementation in a particular IC referred to herein as the "target IC." Placement process 208 receives synthesized circuit design 206. Placement process 208 is capable of assigning elements of synthesized circuit design 206 to particular instances of circuit blocks (e.g., circuit resources) having specific locations on the target IC. Placement process 208 generates placed circuit design 210. Placed circuit design 210 is provided to router 212.

Router 212 is capable of performing a multi-stage routing flow. In the example, router 212 includes a global router 214 and a detailed router 218. Routing refers to the process of selecting or implementing particular routing resources, e.g., wires and/or other interconnect circuitry, to electrically couple the various circuit blocks of placed circuit design 210.

In the example of FIG. 2, a detailed routing graph 222 is provided to a graph transformer 224. Graph transformer 224 operates on detailed routing graph 222 and generates a hybrid routing graph 226. Detailed routing graph 222 may be a detailed specification of the interconnect circuitry of the target IC that is used for routing. Detailed routing graph 222 specifies each available node, e.g., routing resource, of the target IC that may be used for routing placed circuit design 210.

In some aspects, graph transformer 224 applies particular criteria in selecting which portions or routing nodes of detailed routing graph 222 to merge into coarsened routing nodes. One example criterion is that the circuitry, as represented by a plurality or cluster of detailed routing nodes to be merged, is independent. Independent means non-overlapping. Another criterion is that the selected portion of circuitry to be represented as a coarsened routing node must incur sufficient runtime penalties during routing so that creating a coarsened routing node from the selected portion provides at least a predetermined minimum amount of runtime improvement for EDA framework 150 and, more particularly, router 212.

Coarsening techniques other than those illustrated within this disclosure operate differently. Such other techniques give no consideration to the interconnect circuit architecture of the target IC. Instead, available techniques select nodes that behave the same way such as those nodes that convey signals in the same direction or select nodes that drive similar circuit resources. These nodes are then merged into columns. Such techniques do not consider independence between the coarsened components. In consequence, a significant amount of rip-up-and-rerouting of nets is necessary to generate a legal routing solution.

Hybrid routing graph 226, unlike detailed routing graph 222, does not specify each routing resource of the target IC that is available to route placed circuit design 210. Rather, hybrid routing graph 226 includes a combination of both routing nodes (e.g., nodes that represent actual routing resources of the target IC) and abstractions of a plurality of routing nodes referred to as coarsened routing nodes. Each coarsened routing node in hybrid routing graph 226 represents a plurality of the underlying routing nodes of detailed routing graph 222. That is, graph transformer 224 is capable of selecting particular routing nodes of detailed routing graph 222 that correspond to selected circuit structures, group or cluster the routing nodes according to different instances of the selected circuit structures, and represent each group or cluster as a single, larger routing node referred to as a coarse routing node. Graph transformer 224 is capable of representing the plurality of routing nodes of each instance of the selected circuit structure as a coarsened routing node in hybrid routing graph 226.

In one or more example implementations, graph transformer 224 may be omitted from framework 150. In that case, hybrid routing graph 226 may be pre-generated for each of a variety of different target ICs and made available to EDA framework 150 and, more particularly, to global router 214 for performing global routing.

Global router 214 is capable of receiving placed circuit design 210 and hybrid routing graph 226. Global router 214 performs global routing on placed circuit design 210 using hybrid routing graph 226 to generate a global routing solution 216. Because global routing solution 216 is specified using hybrid routing graph 226 and the coarse routing nodes contained therein, global routing solution 216 is not a legal solution. That is, there may be overlapping nets for one or more of the coarsened routing nodes. These overlapping nets may be assigned to different constituent routing resources of the various coarsened routing nodes during detailed routing such that the overlapping nets no longer overlap.

Detailed router 218 receives global routing solution 216 and detailed routing graph 222. Detailed router 218 is capable of performing detailed routing. The detailed routing stage may be viewed as a legalization stage where each routing problem, in reference to each coarsened routing node of hybrid routing graph 226 that has one or more nets traversing therethrough, is contained to a section of detailed routing graph 222 and can be processed in parallel.

For those nets of placed circuit design 210 that were routed using the coarsened routing nodes from the global routing, detailed router 218 is capable of routing the nets through particular detailed routing resources of detailed routing graph 222 that were previously abstracted or represented collectively as a coarsened routing node in hybrid routing graph 226. Detailed router 218 is capable of generating a legal routing solution 220 that may be output.

For example, in performing detailed routing, detailed router 218 is capable of splitting each coarsened routing node back into the constituent parts (e.g., the plurality of constituent routing nodes) that were merged to create the respective coarsened routing nodes resulting in the original detailed routing graph 222. Detailed router 218 is capable of legalizing the coarsened routes through the coarsened routing nodes. In some cases, this requires detailed router 218 to expand the potential routing solution beyond the global routes and re-route several sections of the routing to find legal routing solution 220.

In one or more examples, global routing solution 216 may be specified as a globally routed version of placed circuit design 210. In another aspect, global routing solution 216 may be specified as a separate data structure or file(s) that is/are used with placed circuit design 210. Similarly, legal routing solution 220 may be specified as a fully routed version of placed circuit design 210. In another aspect, legal routing solution 220 may be specified as a separate data structure or file(s) specifying a legal routing for placed circuit design 210.

Figure 3:
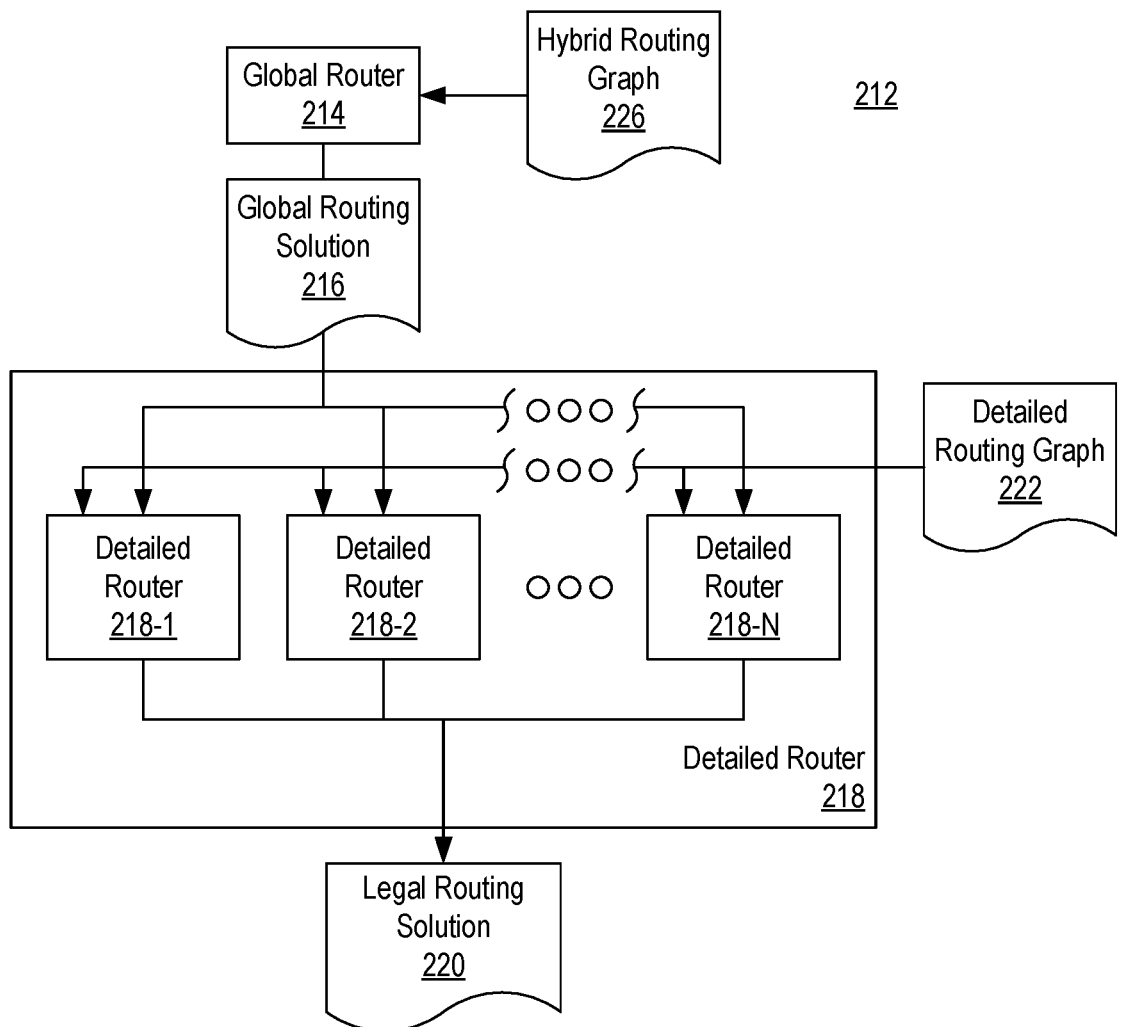
FIG. 3 illustrates certain operative features of an example implementation of a router of an EDA framework.

FIG. 3 illustrates certain operative features of an example implementation of router 212 of FIG. 2. In the example of FIG. 2, the parallelism that may be implemented in detailed router 218 is shown. In the example, detailed router 218 is implemented as multiple, parallel operating instances 218-1, 218-2, through 218-N. In one or more example implementations, a different and independent instance of detailed router 218 may be implemented so that each such instance of detailed router 218 is tasked with routing the net, or nets, that correspond to, or utilize (e.g., traverse) a single and particular coarsened routing node. The parallelism illustrated can significantly increase the speed of the detailed routing that is performed (e.g., reduce the runtime of detailed router 218).

For example, each router instance 218 is capable of operating on a different coarsened routing node. Each coarsened routing node represents the collection of underlying routing nodes that were abstracted. Thus, each router instance 218 is operating on a much smaller routing graph, e.g., the routing nodes of the coarsened routing node, compared to detailed routing graph 222 to find a legal solution. This significantly reduces the computational complexity. Further, as noted, the routing graph (coarsened routing node) that is operated on by each router instance 218 is independent of the routing graph (e.g., coarsened routing node) operated on by each other router instance 218. This independence of the detailed routing solution for each coarsened routing node does not affect any other detailed routing solution of any other coarsened routing node and, as such, therefore can be done in isolation and in parallel without loss of solution quality.

In some aspects, each of the individual instances of detailed router 218 may be implemented as a Satisfiability Solver (SAT solver). A SAT solver may be implemented as a Boolean satisfiability problem solver. Such applications are known in the art and commercially available. Any of a variety of different SAT-solvers can be used and the embodiments disclosed herein are not intended to be limited by the particular type of SAT-solver that is selected. In general, a SAT-solver determines whether, given a set of Boolean equations, there exists a set of values for the variables of the equations that will make the entire expression, or set of expressions, true. That set of variables, in this context, defines a detailed routing solution for each of the respective coarsened routing nodes operated on by a respective instance of detailed router 218. Each of the routing problems operated on by an instance of detailed router 218 is small enough that a SAT solver implementation is capable of determining a legal routing solution for the routing problem quickly.

In some other aspects, each instance of detailed router 218 may be implemented as an iterative router.

In some other aspects, each instance of detailed router 218 may be implemented as a mapper that is capable of selecting a pre-compiled legalization solution from a plurality of available or accessible pre-compiled legalization solutions. Each mapper, for example, may receive a pin signature. The pin signature, for a given coarsened routing node, specifies a number of input pins of the coarsened routing node used by the nets traversing therethrough (e.g., the signals received as inputs) and the particular output pins of the coarsened routing node to which each input pin is to connect. This pin signature may be used by the mapper to select a particular pre-compiled legalization solution from the plurality of pre-compiled legalization solutions stored that has the same pin signature or that matches the pin signature. Each of the mappers, after selecting a pre-compiled routing solution that matches the received pin signature, is capable of instantiating the pre-compiled legalization solution for the circuit design.

In one or more example implementations, the target IC may be a programmable IC such as a Field Programmable Gate Array, a System-on-Chip, or other IC that includes at least some programmable circuitry. Programmable logic is an example of programmable circuitry. Typically, the general structure of programmable circuitry has a tiled architecture. An example of a tile architecture for an IC is illustrated in FIG. 8. The tiles of the IC, in reference to the circuit blocks, may be interconnected by routing circuits and connection circuits. In many cases, interconnect tiles that include routing resources (e.g., wires) are stamped and repeated based on the floorplan of the target IC. This allows commercial vendors to create device floorplans with varying features and capacities, while using the same interconnect circuit architecture.

Routing circuits may be used to make connections between circuit resources of the target IC that span multiple interconnect tiles. Routing circuits are used by signals to route inter-tile connections. The connectivity pattern in the interconnect circuit architecture ensures that there is enough flexibility for signals to take versatile paths moving from one type of circuit resource to another in many or all possible directions. Connection circuits are used to make connections into the input/output interface of the associated logic circuit block. The connection circuits are also referred to as "input interconnect blocks" or "IIBs."

Figure 4:
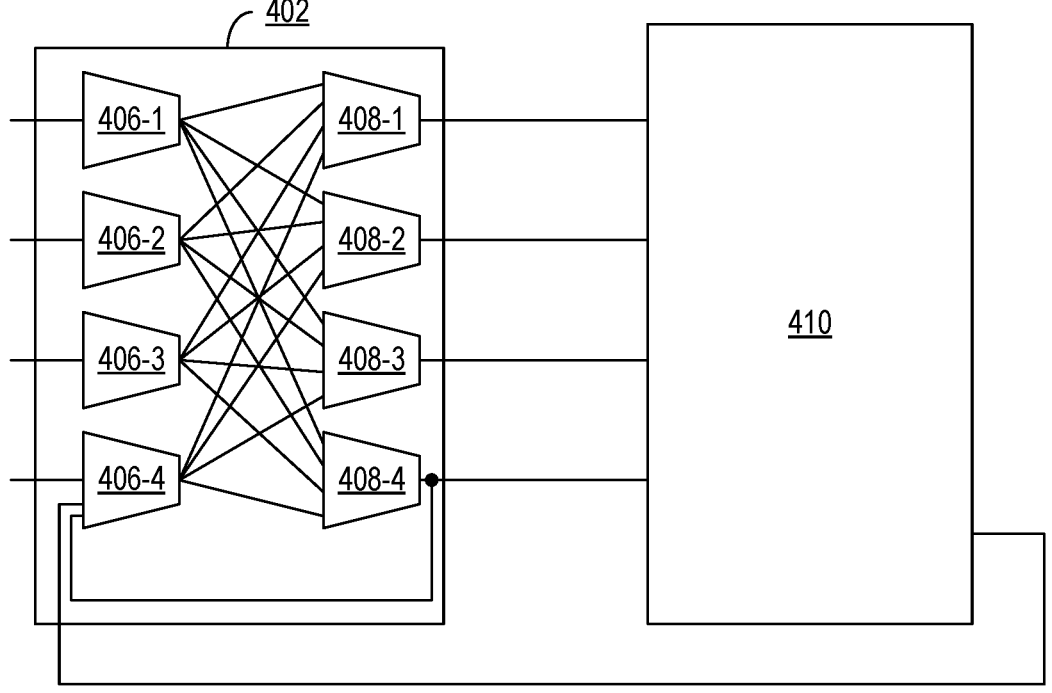
FIG. 4 illustrates an example circuitry of a target integrated circuit (IC).

FIG. 4 illustrates an example circuitry of the target IC. In the example of FIG. 4, an IIB 402 is illustrated. IIB 402 includes a plurality of switches 406 (e.g., 406-1, 406-2, 406-3, and 406-4) cross-connected with a plurality of switches 408 (e.g., 408-1, 408-2, 408-3, 408-4). Switches 406 and 408, in some examples, may be implemented as multiplexers. As shown, the outputs of switches 408 are connected to a logic block 410. Logic block 410 may be implemented as a configurable logic block (CLB). For example, logic block 410 may include one or more lookup-table (LUT) circuits.

The example of FIG. 4 illustrates routing details as may be specified by detailed routing graph 222. That is, detailed routing graph 222 will specify each of the available routing nodes representing routing resources, e.g., wires, available within IIBs 402 across the target IC.

Figure 5:
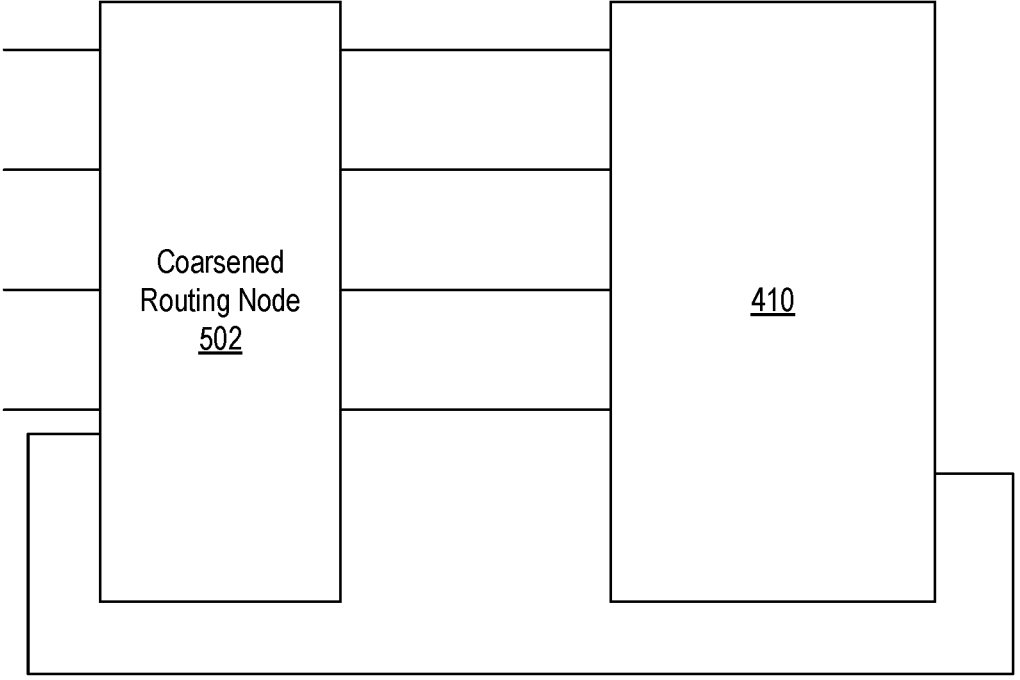
FIG. 5 illustrates an example in which an input interconnect block has been coarsened and represented by a coarsened routing node.

FIG. 5 illustrates an example in which an IIB 402, which may be fully specified within detailed routing graph 222, has been coarsened and represented by a coarsened routing node 502. Coarsened routing node 502 is an example of the type of operation that may be performed by graph transformer 224 in generating hybrid routing graph 226.

FIG. 5 also illustrates an example of certain operative features of graph transformer 224. In some aspects, graph transformer 224 may be programmed with heuristics for selecting particular circuit structures of the target IC and merging the individual nodes of the circuit structures into a single routing node, e.g., a coarsened routing node. The coarsened routing node may have some capacity in terms of a number of signals that may be received as input and output. As noted, the coarsening operations performed by graph transformer 224 reduce the size of the routing graph used for global routing thereby supporting faster overall routing of the circuit design.

The example of FIG. 5 also illustrates that by selecting a circuit structure such as IIBs 402, each IIB 402 is independent of each other IIB. For example, the IIB 402 for a given logic block does not overlap with or interfere with the IIBM 402 for a different logic block. Thus, the portions of the circuit design corresponding to, e.g., routed through the IIBs as represented by coarsened routing nodes 502, are independent (e.g., non-overlapping) thereby allowing each such portion of the circuit design to undergo detailed routing (e.g., legalization) in parallel. The detailed routing solution for a given IIB does not interfere with or have an influence on the detailed routing solution for a different IIB.

FIG. 6 illustrates an example method 600 of routing a circuit design in accordance with the inventive arrangements described herein. Method 600 may be performed by EDA framework 150.

In block 602, graph transformer 224 optionally generates hybrid routing graph 226 from detailed routing graph 222 of a target IC using a selected coarsening technique. In one or more examples, graph transformer 224 is capable of selecting different instances of particular circuit architectures of detailed routing graph 222 having multiple routing nodes. For each instance, graph transformer 224 is capable of merging the nodes into a single node called a coarsened routing node.

In one or more examples, graph transformer 224 is programmed with knowledge of the logical layout of the interconnect circuit architecture of the target IC (e.g., the interconnect tiles and the connections made). Graph transformer 224 is capable of identifying clusters or sections of interconnect resources that can be merged together for coarsening as a coarsened routing node. For example, each coarsened routing node represents an interconnect circuit structure of the target IC. The interconnect circuit structures may be IIBs 402. In general, interconnect circuit structures such as, for example, IIBs 402, are involved in the majority of rip-up-and-reroute operations that occur during detailed routing thereby meeting one of the criteria previously mentioned concerning the incurring of sufficient runtime penalties. The clusters of interconnect resources identified are independent of one another thereby meeting another one of the criteria previously mentioned. This results in the coarsened routing nodes that are generated also being independent (e.g., non-overlapping) of one another.

It should be appreciated that while IIBs are used within this disclosure for purposes of illustration, other portions or sections of interconnect circuitry may be selected and represented as coarsened routing nodes. The inventive arrangements are not intended to be limited to the examples provided.

In another aspect, as noted, graph transformer 224 may be omitted from EDA framework 150. In that case, hybrid routing graph 226 may be pre-generated for each of a variety of different target ICs and made available to EDA framework 150 and router 212 for performing the multi-stage routing flow described herein. In any case, hybrid routing graph 226 includes a combination of coarsened routing nodes and routing nodes as specified in detailed routing graph 222.

In block 604, optionally one or more routing nodes belonging to an interconnect circuit structure that is represented by a coarsened routing node may be excluded from the coarsened routing node so that the excluded routing node(s) are available for use during the global routing stage. In one or more example implementations, certain routing nodes may be exposed during the global routing stage. By exposing selected nodes during global routing in lieu of including the routing nodes within coarsened routing nodes, the likelihood of generating a legal routing solution is increased. Further detail relating to block 604 is provided below in connection with FIG. 7.

In block 606, global router 214 performs a global routing of a circuit design using hybrid routing graph 226 for the target IC. As discussed, the circuit design operated on by global router 214 has been placed. In one aspect, hybrid routing graph 226 includes routing nodes (e.g., routing nodes from detailed routing graph 222) and a plurality of coarsened routing nodes. Each coarsened routing node includes a plurality of constituent routing nodes of detailed routing graph 222 that are treated as a single node during the global routing stage.

In one aspect, the global routing solution specifies routes that involve routing nodes of detailed routing graph 222 that are included in hybrid routing graph 226 and routes that utilize the coarsened routing nodes. Routes for nets that traverse through or use a coarsened routing node may be referred to as "coarsened" routes. The global routing solution, as discussed, is not a legal routing solution in that the global routing solution includes overlapping routes. That is coarsened routes that traverse the coarsened routing nodes may overlap.

For example, any overlapping nodes that exist in the global routing solution may exist only on the coarsened routing nodes. Un-coarsened routing nodes (e.g., the detailed nodes from detailed routing graph 222 that are not represented by a coarsened routing node) cannot have overlapping routes in the global routing solution. In some aspects, global router 214 operates according to the principle that each routing node in the routing graph has a "capacity." The capacity of a routing node defines the number of routes that can overlap on that routing node. The capacity of coarsened routing nodes can be equal to the maximum number of routes that can exist on the set of constituent nodes inside the coarsened routing node (e.g., which is greater than 1). By comparison, the capacity of an un-coarsened routing node is 1.

In block 608, detailed router 218 performs a detailed routing of the circuit design to generate a legal routing solution for the circuit design. The detailed routing is performed by routing, in parallel, nets of the circuit design that were globally routed using the plurality of coarsened routing nodes. That is, detailed router 218 is capable of generating a legalized route for the nets having coarsened routes that traverse the coarsened routing nodes. In other words, detailed router 218 is capable of generating a legalized route for the portion of any net routed during global routing using a coarsened routing node. Detailed router 218 generates a legal solution for each such coarsened routing node using the constituent routing resource represented by the coarsened routing node.

As discussed, detailed router 218 is capable of splitting each coarsened routing node back into the constituent parts (e.g., the plurality of constituent routing nodes) that were merged to create the respective coarsened routing node. Detailed router 218 is capable of routing the nets that traverse the coarsened routing node using the constituent routing nodes to generate a legalized route for each such coarsened route. Thus, the legal routing solution generated by detailed router 218 (e.g., the plurality of instances thereof operating in parallel) specifies detailed routes of nets using selected ones of the plurality of constituent routing nodes that were previously abstracted by the coarsened routing nodes.

In one aspect, the detailed routing is performed by executing a plurality of SAT solvers in parallel. In another aspect, the detailed routing is performed using a plurality of mappers executing in parallel. Each mapper is configured to select a pre-compiled routing solution from a plurality of pre-compiled routing solutions for a coarsened routing node based on a pin signature of the coarsened routing node. The multi-stage routing flows described are capable of providing approximately a 3.2× reduction in runtime of the routing tools.

Referring to the processing described in block 604 of FIG. 6, there are particular routing problems in which a legal routing solution may not be obtained using the techniques described herein. Certain classes of input connections for a coarsened routing node cause unsatisfiability during detailed routing. Rip-up-and-rerouting for such routing problems becomes necessary, which leads to longer runtimes for the routing tools.

In some aspects, as illustrated in block 604, such connections may be identified a priori. By removing these identified connections from the coarsening process prior to the global routing stage, the percentage of these routing problems that caused unsatisfiability requiring rip-up-and-reroute may be reduced. For example, by removing known problematic connections from the coarsening process, the number of routing problems for which legal routing solutions were determined (without engaging in rip-up-and-reroute) grew approximately 3-fold.

Figure 7:
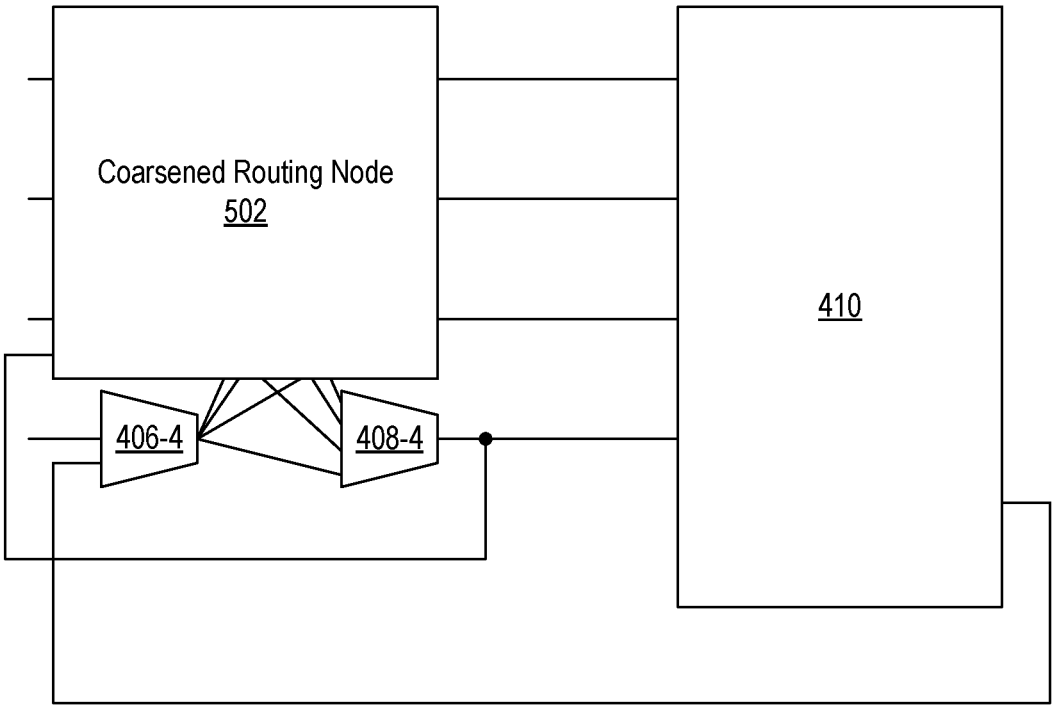
FIG. 7 illustrates an example in which selected connections are excluded from the coarsened routing node that is generated.

FIG. 7 illustrates an example in which selected connections, e.g., routing nodes, are excluded from coarsened routing node 502 that is generated. In this example, based on an analysis of routing problems that were found to be unsatisfiable (e.g., routing problems for which a legal solution was not achieved and/or rip-up-and-reroute was required), the problematic connections or routing nodes may be identified within detailed routing graph 222 based on placed circuit design 210.

In the example of FIG. 7, certain routing nodes of IIB 402 have feedback connections that may be utilized by a user's design. Referring to FIG. 4, switch 408-4 has a feedback connection to switch 406-4. For purposes of illustration, switch 408-4 may be implemented as a special case switch that is capable of driving a selected pin of logic block 410 and driving back into IIB 402 by way of a feedback path. Within a user circuit design, if the selected pin on logic block 410 must be driven, then switch 408-4 must be used since switch 408-4 is the only way to drive the selected pin of logic block 410. Therefore, switch 408-4 may not be used for routing other nets (e.g., may not be used to provide a feedback path).

In this example, switch 406-4 and switch 408-4 have been excluded from coarsened routing node 502 unlike in the example of FIG. 5 where switches 406-4 and 408-4 were included in the cluster of routing nodes represented by coarsened routing node 502. In the example, by un-coarsening this part, e.g., leaving switches 406-4 and 408-4 out of coarsened routing node 502, global router 214 is capable of locking switch 408-4 such that the feedback path cannot be used since switch 408-4 must be used to route the net that drives the selected pin of logic block 410.

By excluding switches 406-4 and 408-4 from coarsened routing node 502, a larger routing cone is obtained for the global routing stage. The larger routing cone includes more switches that may be used during global routing. Thus, global router 214 is able to utilize coarsened routing node 502, switch 406-4, and switch 408-4 during global routing rather than just coarsened routing node 502. This allows router 212 to generate a legal routing solution (e.g., without having to perform rip-up-and-reroute operations) in those situations where a legal routing solution was only previously attainable by performing rip-up-and-reroute operations. The added complexity in hybrid routing graph 226 does result in a reduction in the performance achieved. For example, the reduction in runtime in applying the technique illustrated in block 604 and FIG. 7 results in a reduction in runtime of approximately 2.6× as opposed to the 3.2× reduction previously discussed, but results in a larger number of routing problems being solved without having to perform rip-up-and-reroute.

With reference to FIG. 7, in one or more examples, EDA framework 150 is capable of identifying or detecting any switches (e.g., multiplexers) that have characteristics the same as and/or similar to switch 408-4. The characteristics in this example include the switch being able to drive a particular pin and, in the alternative, provide a feedback path. The characteristics also include the switch being the only component that is able to drive the particular pin. EDA framework 150 excludes the identified switches from the coarsened routing node being formed.

In one or more other examples, not every instance of a detected switch (e.g., not each instance of switch 408-4 of the target IC) needs to be excluded from a corresponding coarsened routing node 502. For example, EDA framework 150 is capable of analyzing the placement of the user's circuit design and determining exactly which of switches 408-4 of the target IC are required as pin drivers and which may be used as feedback paths if necessary. In that case, EDA framework 150 is capable of selectively un-coarsening only instances of switches 408-4 that must operate as drivers of the selected pins of the corresponding logic block 410.

In the example of FIG. 7, the un-coarsening of switch 406-4, which drives into switch 408-4, is optionally performed. That is, in some cases switch 406-4 may be included in coarsened routing node 502 while switch 408-4 is not. Excluding switch 406-4 with switch 408-4 can improve the chances of success since there exists one "dedicated" path into the selected pin driven by switch 408-4. Global router 214, for example, may be tuned to use such paths when available. Still, it should be appreciated that switch 408-4 may be excluded from coarsened routing node 502 while switch 406-4 is included in coarsened routing node 502.

In one or more other example implementations, certain heuristics may be implemented in placement process 208 that increase the likelihood of routing success using the techniques described within this disclosure. For example, given the number of pins available on a logic block such as a CLB, the circuit design may be placed so that the number of pins of a logic block used by the design does not exceed a threshold, where the threshold is set to a number of pins below the total number of pins available on the logic block. This heuristic spreads out the logic of the circuit design during placement leading to a lesser density throughout the target IC, which increases the likelihood of routing success (e.g., finding a legal routing solution).

FIG. 8 illustrates an example architecture 800 for an IC. In one aspect, architecture 800 may be implemented within a programmable IC. A programmable IC is an IC with at least some programmable circuitry. Programmable circuitry may include programmable logic. For example, architecture 800 may be used to implement an FPGA. Architecture 800 may also be representative of an SoC. An example of an SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 800 includes several different types of programmable circuit, e.g., logic, blocks. For example, architecture 800 may include a large number of different programmable tiles including multi-gigabit transceivers (MGTs) 801, configurable logic blocks (CLBs) 802, random-access memory blocks (BRAMs) 803, input/output blocks (IOBs) 804, configuration and clocking logic (CONFIG/CLOCKS) 805, digital signal processing blocks (DSPs) 806, specialized I/O blocks 807 (e.g., configuration ports and clock ports), and other programmable logic 808 such as digital clock managers, analog-to-digital converters, system monitoring logic, and so forth.

In some ICs, each programmable tile includes a programmable interconnect element (INT) 811 having standardized connections to and from a corresponding INT 811 in each adjacent tile. Therefore, INTs 811, taken together, implement the programmable interconnect structure for the illustrated IC. Each INT 811 also includes the connections (e.g., IIBs) to and from the programmable logic element within the same tile, as shown by the examples included at the right of FIG. 8.

For example, a CLB 802 may include a configurable logic element (CLE) 812 that may be programmed to implement user logic plus a single INT 811. A BRAM 803 may include a BRAM logic element (BRL) 813 in addition to one or more INTs 811. Typically, the number of INTs 811 included in a tile depends on the height of the tile. As pictured, a BRAM tile has the same height as five CLBs, but other numbers (e.g., four) also may be used. A DSP tile 806 may include a DSP logic element (DSPL) 814 in addition to an appropriate number of INTs 811. An IOB 804 may include, for example, two instances of an I/O logic element (IOL) 815 in addition to one instance of an INT 811. The actual I/O pads connected to IOL 815 may not be confined to the area of IOL 815.

In the example pictured in FIG. 8, the shaded area near the center of the die, e.g., formed of regions 805, 807, and 808, may be used for configuration, clock, and other control logic. Shaded areas 809 may be used to distribute the clocks and configuration signals across the breadth of the programmable IC.

Some ICs utilizing the architecture illustrated in FIG. 8 include additional logic blocks that disrupt the regular columnar structure making up a large part of the IC. The additional logic blocks may be programmable blocks and/or dedicated circuitry. For example, a processor block depicted as PROC 810 spans several columns of CLBs and BRAMs.

In one aspect, PROC 810 may be implemented as dedicated circuitry, e.g., as a hardwired processor, that is fabricated as part of the die that implements the programmable circuitry of the IC. PROC 810 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 810 may be omitted from architecture 800 and replaced with one or more of the other varieties of the programmable blocks described. Further, such blocks may be utilized to form a "soft processor" in that the various blocks of programmable circuitry may be used to form a processor that can execute program code as is the case with PROC 810.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 8 that are external to PROC 810 such as CLBs 802 and BRAMs 803 are considered programmable circuitry of the IC.

In general, the functionality of programmable circuitry is not established until configuration data is loaded into the IC. A set of configuration bits may be used to program programmable circuitry of an IC such as an FPGA. In some cases, configuration data may also be referred to as a "configuration bitstream." In general, programmable circuitry is not operational or functional without first loading configuration data into the IC. The configuration data effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of configuration data. Hardwired circuitry is generally considered to have dedicated circuit blocks and interconnects, for example, that are functional without first loading configuration data into the IC, e.g., PROC 810.

In some instances, hardwired circuitry may have one or more operational modes that can be set or selected according to register settings or values stored in one or more memory elements within the IC. The operational modes may be set, for example, through the loading of configuration data into the IC. Despite this ability, hardwired circuitry is not considered programmable circuitry as the hardwired circuitry is operable and has a particular function when manufactured as part of the IC.

In the case of an SoC, the configuration data may specify the circuitry that is to be implemented within the programmable circuitry and the program code that is to be executed by PROC 810 or a soft processor. In some cases, architecture 800 includes a dedicated configuration processor that loads the configuration data to the appropriate configuration memory and/or processor memory. The dedicated configuration processor does not execute user-specified program code. In other cases, architecture 800 may utilize PROC 810 to receive the configuration data, load the configuration data into appropriate configuration memory, and/or extract program code for execution.

FIG. 8 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the right of FIG. 8 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 810 within the IC are for purposes of illustration only and are not intended as limitations.

A system as described herein in connection with FIG. 1, for example, is capable of further processing a circuit design having undergone the processing described herein for implementation within an IC having an architecture the same as or similar to that of FIG. 8. The system, for example, is capable of synthesizing, placing, and routing the circuit design. The system may also generate configuration data that, when loaded into the IC, physically implements or realizes the circuit design within the IC.

As discussed, the inventive arrangements may be used with any of a variety of different types of interconnect circuit structures. Such circuit structures may be used to connect to any of the various circuit blocks described in connection with FIG. 8. For example, interconnect circuit structures that connect to CLBs 802, BRAMs 803, DSP tiles 806, IOBs 804, and/or other circuit blocks may be represented using coarsened routing nodes.

The inventive arrangements described herein are described in connection with ICs such as programmable IC. It should be appreciated that the inventive arrangements are not intended to be limited in this regard. The inventive arrangements also may be utilized in routing other types of ICs such as Application-Specific ICs.

The terminology used herein is for the purpose of describing particular embodiments only and is not intended to be limiting. Notwithstanding, several definitions that apply throughout this document are expressly defined as follows.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention.

As defined herein, the term "computer-readable storage medium" means a storage medium that contains or stores program instructions for use by or in connection with an instruction execution system, apparatus, or device. As defined herein, a "computer-readable storage medium" is not a transitory, propagating signal per se. The various forms of memory, as described herein, are examples of computer-readable storage media. A non-exhaustive list of examples of computer-readable storage media include an electronic storage device, a magnetic storage device, an optical storage device, an electromagnetic storage device, a semiconductor storage device, or any suitable combination of the foregoing. A non-exhaustive list of more specific examples of a computer-readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "individual" and "user" each refer to a human being.

As defined herein, the term "hardware processor" means at least one hardware circuit. The hardware circuit may be configured to carry out instructions contained in program code. The hardware circuit may be an integrated circuit. Examples of a hardware processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

As defined herein, the terms "one embodiment," "an embodiment," "in one or more embodiments," "in particular embodiments," or similar language mean that a particular feature, structure, or characteristic described in connection with the embodiment is included in at least one embodiment described within this disclosure. Thus, appearances of the aforementioned phrases and/or similar language throughout this disclosure may, but do not necessarily, all refer to the same embodiment.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc., may be used herein to describe various elements. These elements should not be limited by these terms, as these terms are only used to distinguish one element from another unless stated otherwise or the context clearly indicates otherwise.

One or more computer-readable storage medium (or media) have computer-readable program instructions thereon for causing a processor to carry out aspects of the inventive arrangements described herein. Within this disclosure, the term "program code" is used interchangeably with the term "program instructions." Computer-readable program instructions described herein may be downloaded to respective computing/processing devices from a computer-readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer-readable program instructions may include state-setting data. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer-readable program instructions by utilizing state information of the computer-readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer-readable storage medium(s). It will be understood that each block of the flowchart illustrations and/or block diagrams, and combinations of blocks in the flowchart illustrations and/or block diagrams, may be implemented by computer-readable program instructions, e.g., program code.

These computer-readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the operations specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer-readable storage medium(s) according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
generating a hybrid routing graph by detecting input interconnect blocks in a circuit design and representing groups of the input interconnect blocks as a plurality of coarsened routing nodes, wherein the plurality of coarsened routing nodes are independent of one another;
performing, using computer hardware, a global routing of the circuit design using the hybrid routing graph for a target integrated circuit;
wherein the hybrid routing graph includes routing nodes and the plurality of coarsened routing nodes, each coarsened routing node including a plurality of constituent routing nodes of the hybrid routing graph corresponding to the input interconnect blocks that are treated as a single node during the global routing; and
performing, using the computer hardware, a detailed routing of the circuit design to generate a legal routing solution for the circuit design;
wherein the detailed routing is performed by routing, in parallel, nets of the circuit design that were globally routed using the plurality of coarsened routing nodes.

2. The method of claim 1, wherein the legal routing solution specifies detailed routes of the nets through the plurality of coarsened routing nodes using selected ones of the plurality of constituent routing nodes of the plurality of coarsened routing nodes.

3. The method of claim 1, wherein the detailed routing is performed by executing a plurality of Satisfiability (SAT) solvers in parallel.

4. The method of claim 1, wherein the detailed routing is performed by executing a plurality of iterative routers in parallel.

5. The method of claim 1, wherein the detailed routing is performed by executing a plurality of mappers in parallel, wherein each mapper is configured to select a pre-compiled routing solution from a plurality of pre-compiled routing solutions for a coarsened routing node based on a pin signature of the coarsened routing node.

6. The method of claim 1, wherein, for a selected coarsened routing node of the plurality of coarsened routing nodes, one or more input interconnect blocks having feedback are excluded from a group of the input interconnect blocks used to form the selected coarsened routing node.

7. The method of claim 1, wherein a solution to the global routing is an illegal routing solution including a plurality of overlapping routes on one or more of the plurality of coarsened routing nodes.

8. The method of claim 1, further comprising:
excluding a selected routing node belonging to an interconnect circuit structure from a selected coarsened routing node representing the interconnect circuit structure so that the selected routing node is available for use during the global routing.

9. A system, comprising:
one or more hardware processors configured to initiate operations including:
generating a hybrid routing graph by detecting input interconnect blocks in a circuit design and representing groups of the input interconnect blocks as a plurality of coarsened routing nodes, wherein the plurality of coarsened routing nodes are independent of one another;

performing a global routing of the circuit design using the hybrid routing graph for a target integrated circuit;

wherein the hybrid routing graph includes routing nodes and the plurality of coarsened routing nodes, each coarsened routing node including a plurality of constituent routing nodes of the hybrid routing graph corresponding to the input interconnect blocks that are treated as a single node during the global routing; and performing a detailed routing of the circuit design to generate a legal routing solution for the circuit design;

wherein the detailed routing is performed by routing, in parallel, nets of the circuit design that were globally routed using the plurality of coarsened routing nodes.

10. The system of claim 9, wherein the legal routing solution specifies detailed routes of the nets through the plurality of coarsened routing nodes using selected ones of the plurality of constituent routing nodes of the plurality of coarsened routing nodes.

11. The system of claim 9, wherein the detailed routing is performed by executing a plurality of Satisfiability (SAT) solvers in parallel.

12. The system of claim 9, wherein the detailed routing is performed by executing a plurality of mappers in parallel, wherein each mapper is configured to select a pre-compiled routing solution from a plurality of pre-compiled routing solutions for a coarsened routing node based on a pin signature of the coarsened routing node.

13. The system of claim 9, wherein, for a selected coarsened routing node of the plurality of coarsened routing nodes, one or more input interconnect blocks having feedback are excluded from a group of the input interconnect blocks used to form the selected coarsened routing node.

14. The system of claim 9, wherein a solution to the global routing is an illegal routing solution including a plurality of overlapping routes on one or more of the plurality of coarsened routing nodes.

15. The system of claim 9, wherein the one or more hardware processors are configured to initiate operations further comprising:

excluding a selected routing node belonging to an interconnect circuit structure from a selected coarsened routing node representing the interconnect circuit structure so that the selected routing node is available for use during the global routing.

16. One or more computer-readable storage mediums having program instructions embodied therewith, the program instructions executable by computer hardware to cause the computer hardware to initiate executable operations comprising:

generating a hybrid routing graph by detecting input interconnect blocks in a circuit design and representing groups of the input interconnect blocks as a plurality of coarsened routing nodes, wherein the plurality of coarsened routing nodes are independent of one another;

performing a global routing of the circuit design using the hybrid routing graph for a target integrated circuit;

wherein the hybrid routing graph includes routing nodes and the plurality of coarsened routing nodes, each coarsened routing node including a plurality of constituent routing nodes of the hybrid routing graph corresponding to the input interconnect blocks that are treated as a single node during the global routing; and performing a detailed routing of the circuit design to generate a legal routing solution for the circuit design;

wherein the detailed routing is performed by routing, in parallel, nets of the circuit design that were globally routed using the plurality of coarsened routing nodes.

* * * * *